(12) United States Patent
Hong

(10) Patent No.: US 7,193,925 B2
(45) Date of Patent: Mar. 20, 2007

(54) LOW POWER SEMICONDUCTOR MEMORY DEVICE

(75) Inventor: Yun Seok Hong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/879,023

(22) Filed: Jun. 30, 2004

(65) Prior Publication Data

US 2005/0146972 A1    Jul. 7, 2005

(30) Foreign Application Priority Data

Jan. 6, 2004    (KR) ............... 10-2004-0000582

(51) Int. Cl.
*G11C 8/00*    (2006.01)
(52) U.S. Cl. .............. 365/230.06; 365/230.03
(58) Field of Classification Search ........... 365/230.06
See application file for complete search history.

(56) References Cited

U.S. PATENT DOCUMENTS

| | | | |
|---|---|---|---|
| 5,822,261 A * | 10/1998 | Suh | 365/207 |
| 6,191,999 B1 | 2/2001 | Fujieda et al. | |
| 6,459,627 B1 * | 10/2002 | Sakamoto et al. | 365/190 |
| 6,510,094 B2 * | 1/2003 | Chung et al. | 365/222 |
| 6,532,186 B2 * | 3/2003 | Cha | 365/230.03 |
| 6,876,595 B2 * | 4/2005 | Bhavnagarwala et al. | 365/230.06 |
| 6,882,588 B2 * | 4/2005 | Higuchi | 365/205 |

* cited by examiner

Primary Examiner—Thong Q. Le
(74) Attorney, Agent, or Firm—Heller Ehrman LLP

(57) ABSTRACT

A low power semiconductor memory device can reduce power consumption of the whole chip by activating a bit line sense amplifier and a sub word line driver for driving a selected memory cell array block. The low power semiconductor memory device comprises a plurality of memory cell array blocks, a plurality of sense amplifier arrays, a sub word line driver array and a block selecting activation control unit. The block selecting activation control unit selectively activates the sub word line driver and the sense amplifier for driving the memory cell array block corresponding to a block selecting address.

11 Claims, 3 Drawing Sheets

LOW POWER SEMICONDUCTOR MEMORY DEVICE

BACKGROUND OF THE INVENTION

1. Field of the Invention

The present invention generally relates to a low power semiconductor memory device, and more specifically, to a low power semiconductor memory device which activates a sub word line driver and a bit line sense amplifier for driving a selected memory cell array block to reduce power consumption of the whole chip.

2. Description of the Prior Art

In general, when a semiconductor memory device (for example, DRAM) has a memory storage capacitance of 64 M bits, a memory array block comprises four memory blocks. In the semiconductor memory device, two memory array blocks are located up and down in a horizontal direction of a semiconductor chip. In the center there are positioned a power generating circuit and an input/output interface circuit including an address input circuit, a data input/output circuit and a bonding pad array.

As described above, two memory blocks are located left and right, and other two memory blocks are located up and down to the horizontal direction of the semiconductor chip. The two memory blocks located left and right form one group, and a main word line driver is positioned at the center. The main word line driver forms a selecting signal line of a main word line extended to penetrate one memory block. The one memory block includes a memory cell having 4 K bits in a direction of the main word line and 4 K bits in a direction of a bit line perpendicular to the main word line.

The above described one memory block is divided into 8 sub memory blocks in the direction of the main word line. A sub word line driver is located in each sub memory block. The sub word line driver is divided at a length of ⅛ to the main word line, and forms a sub word line selecting signal line extended in parallel with the main word line. In order to reduce the number of main word lines, that is, to increase line pitch of the main word line, four sub word lines are arranged in the direction of the bit line to one main word line. In this way, a sub word line driver is positioned for selecting one of the 8 sub word lines in the direction of the main word line. The sub word line driver forms a selecting signal for selecting one of the four sub word lines extended to the arrangement direction of the sub word line driver.

The 8 sub word lines are positioned in one main word line to its extension direction. The 8 sub word lines are alternately arranged in one memory cell array block. The sub word line driver located between the memory cell array blocks forms a selecting signal of the sub word line of the memory blocks located left and right.

Although the above-described memory block is divided into 8 blocks to the direction of the main word line, the sub word lines corresponding to the two memory blocks are simultaneously selected by the sub word driver. As a result, the memory block is actually divided into 4 blocks. In the above-described configuration where sub word lines are divided into the even number and the odd number and a sub word driver is located at both sides of each memory block, the actual pitch of the sub word line arranged with high density corresponding to the arrangement of the memory cell can be alleviated twice.

The sub word line driver supplies a predecoding signal in common to four sub word lines. Eight predecoding signal line for selecting one of the four sub word lines are positioned. The even numbers of the predecoding signal lines are supplied to the even number rows of the sub word line drivers. The odd numbers of the predecoding lines are supplied to the odd number rows of the sub word line drivers.

A pair of bit lines are positioned perpendicular to the sub word lines arranged in parallel with the main word lines. The bit lines are divided into the even number of rows and the odd number of rows, and bit line sense amplifiers are positioned up and down on the basis of the memory cell array block. A sense amplifier is arranged in parallel with the horizontal direction of the semiconductor chip, and a column decoder is arranged in the center of the chip.

In the configuration where the sense amplifiers are arranged at both sides of the memory block, since bit lines are allotted to the odd number of rows and the even number of rows, the pitch of the sense amplifier array can be increased. Input/output lines, which are arranged depending on the arrangement of the sense amplifiers, are connected to the bit lines through a column switch. The column switch is connected to a column selecting line for receiving a selecting signal of the column decoder.

The DRAM performs a precharge operation before the operation of the memory cell. The precharge operation is to set the bit line to a predetermined precharge voltage. In general, the precharge voltage corresponds to a half (VDD/2) of a power supply voltage VDD. The power consumption and noise which result from charge and discharge of the bit line can be reduced by setting the precharge voltage as a intermediate value between the power supply voltage VDD and the ground voltage VSS.

A word line connected to a specific memory cell is selected, and a pulse voltage (word line selecting pulse) is applied. A signal voltage resulting from information voltages VDD or VSS of a memory cell capacitor is superposed at the precharge voltage, and outputted as a positive or negative signal to the bit line.

Generally, the capacity of the cell capacitor is much smaller than parasitic capacity of the bit line, and the memory cell becomes smaller to reduce the area of the semiconductor chip. As a result, since a plurality of memory cells are connected to one bit line if possible, the cell capacitor becomes smaller and the parasitic capacity of the bit line becomes larger.

The signal voltage which is a positive or negative signal in the bit line is sensed and amplified in the sense amplifier connected to the bit line.

A bit line sense amplifier is operated with the precharge voltage (VDD/2) as a reference voltage. An output voltage of the sense amplifier becomes the power supply voltage VDD if the signal voltage is larger than the reference voltage (VDD/2), and becomes the ground voltage VSS if the signal voltage is smaller than the reference voltage (VDD/2).

Information of all memory cells on the word line for receiving a word line selecting pulse is destroyed. That is, since the capacity of the cell capacitor is sufficiently smaller than the parasitic capacity of the bit line, a storage node of the cell capacitor which has been at the level of the power supply voltage VDD or the ground voltage VSS is charged to the precharge voltage regardless of its information voltage.

As a result, the sense amplifier is positioned at all bit lines, and data are simultaneously amplified to the signal voltage VDD or VSS, and restored in each memory cell.

The operation for writing data in the selected memory cell is performed by applying a word line selecting pulse to the word line and providing one of information voltages VDD and VSS to the bit line.

Here, the read operation is performed before the write operation in order to prevent information of the unselected memory cell from being destroyed.

That is, the read operation is performed in all memory cells on the word line, and an amplification voltage corresponding to information of the memory cell is temporarily maintained in each bit line.

Thereafter, the column selecting switch is turned on to compulsorily substitute the amplification voltage of the selected bit line with the information voltage from a data bus and to input the information voltage to the selected memory cell capacitor.

Here, the amplification voltage of the unselected bit lines on the selected word line is re-written in the unselected memory cell.

The sufficient signal voltage is outputted to the bit line, and a word line selecting pulse voltage is given as one higher than the voltage obtained by adding the power supply voltage VDD and a threshold voltage of the cell transistor.

Meanwhile, the refresh operation is performed by sequentially reading all word lines. That is, the refresh operation is performed in a word line unit, and all memory cells are simultaneously refreshed on the word line. As a result, the storage node voltage of the memory cell capacitor is reduced as leakage current but restored to the initial value. Therefore, information of all memory cells are restored and memory information are maintained to the whole chip by the refresh operation performed on all word lines.

As described above, the conventional semiconductor memory device has large power consumption because whole of the sense amplifiers connected to the activated word line at an active mode are activated.

SUMMARY OF THE INVENTION

It is an object of the present invention to reduce power consumption by activating a sense amplifier and a sub word line driver for driving a selected memory cell array block.

In an embodiment, a low power semiconductor memory device comprises a plurality of memory cell array blocks, a plurality of sense amplifier arrays, a sub word line driver array and a block selecting activation control unit. The plurality of memory cell array blocks are arranged in a matrix type, and each memory cell array block comprises a plurality of memory cells. The plurality of sense amplifier arrays are connected to the memory cell array block, and each sense amplifier array comprises a plurality of sense amplifiers for sensing and amplifying data stored in the memory cells. The sub word line driver array, connected to the memory cell array block, comprises a plurality of sub word line drivers. The block selecting activation control unit selectively activates the sub word line driver and the sense amplifier for driving the memory cell array block corresponding to a block selecting address.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
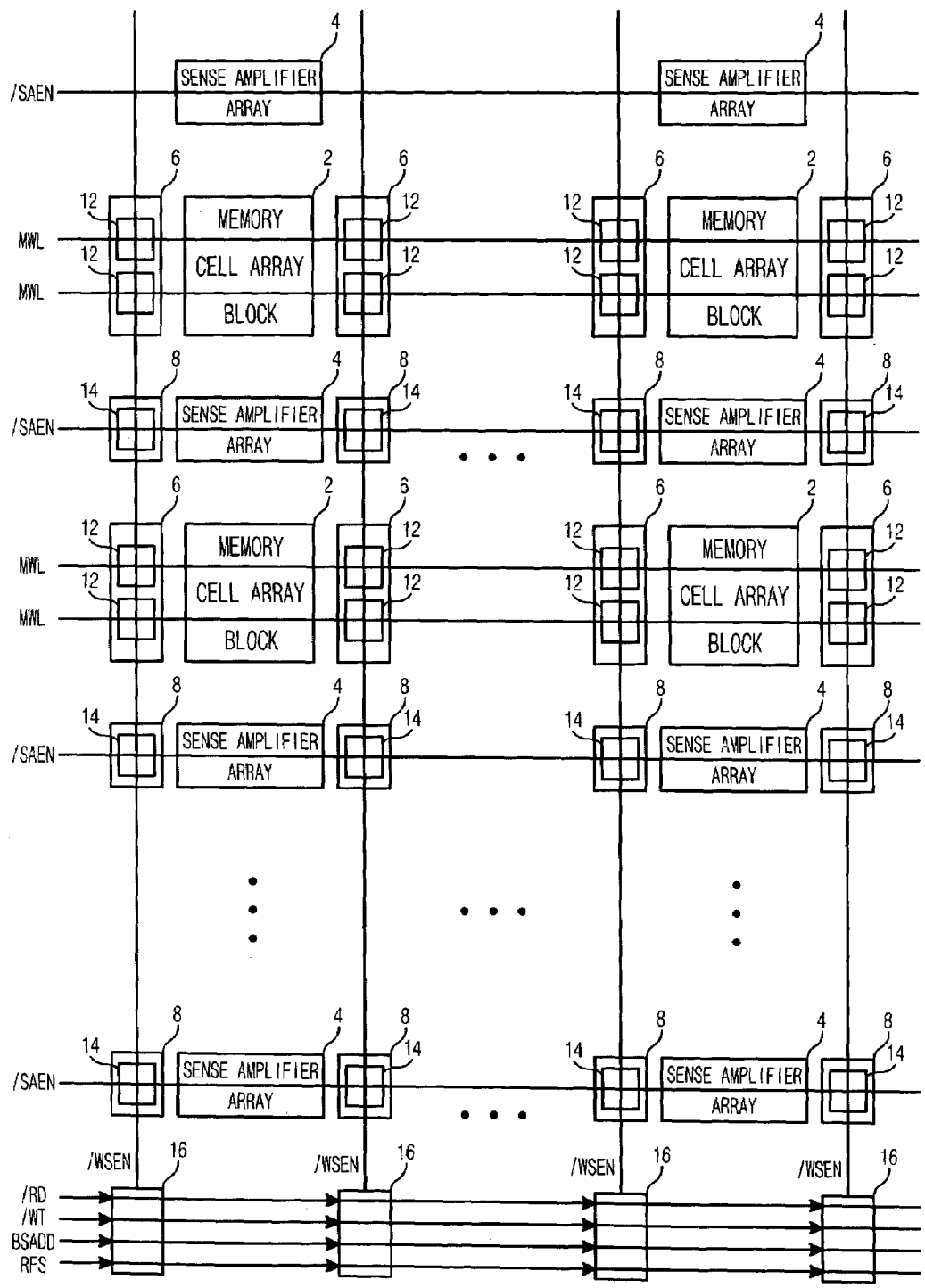
FIG. 1 is a block diagram of a semiconductor memory device according to an embodiment of the present invention.

FIG. 1 is a block diagram of a semiconductor memory device according to an embodiment of the present invention.

In an embodiment, the semiconductor memory device comprises a memory cell array block 2, a sense amplifier array 4, a sub word line driver array 6, a sense amplifier control unit 14 located at a sub hole 8, and a block selecting activation control unit 16.

The memory cell array block 2 comprises a plurality of memory cells which are arranged in a matrix type. The sense amplifier array 4, which is located up and down on a basis of the memory cell array block 2, comprises a plurality of sense amplifiers for sensing and amplifying data stored in a memory cell. The sub word line driver array 6 comprises a plurality of sub word line drivers 12. Each of the sub word line drivers 12 is driven by a main word line MWL, and selects a sub word line for driving the memory cell array block 2 selected in response to a block selecting activation signal /WSEN. The sense amplifier control unit 14 activates the sense amplifier array 4 for driving the memory cell array block 2 selected in response to the block selecting activation signal /WSEN. The block selecting activation control unit 16 generates the block selecting activation signal /WSEN in response to a read command /RD or a write command /WT, a block selecting address BSADD and a refresh signal RFS.

Figure 2:
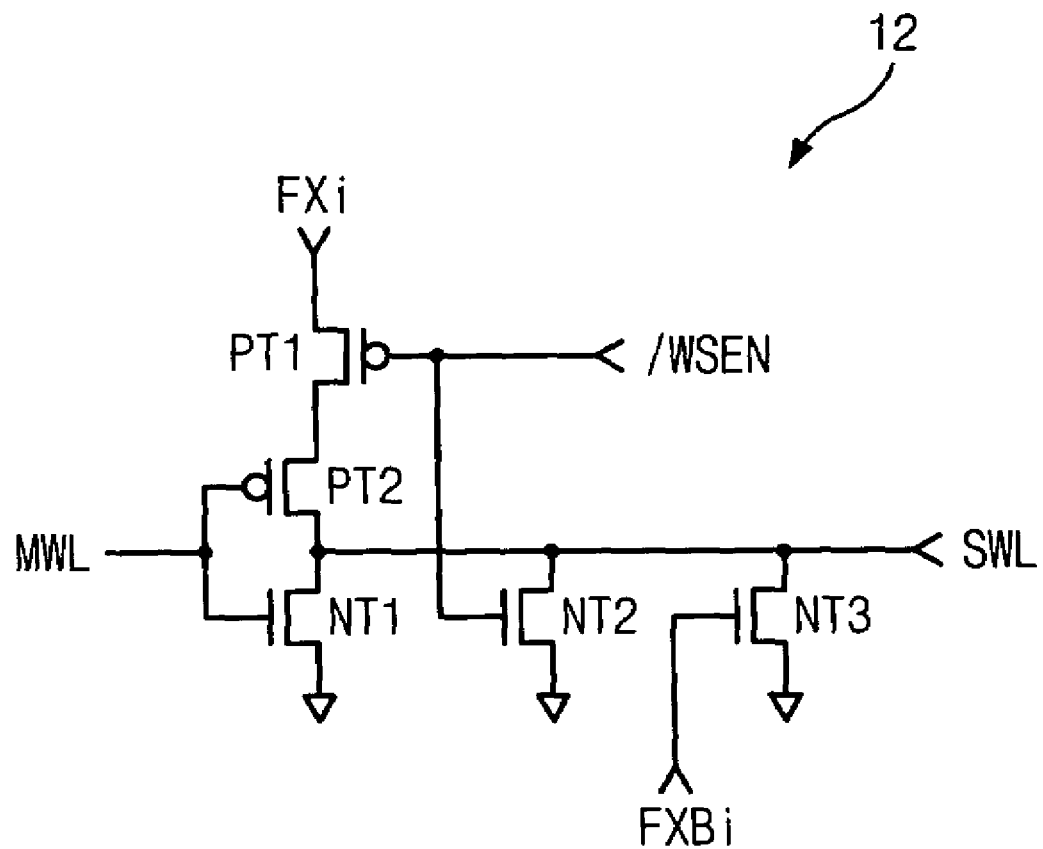
FIG. 2 is a circuit diagram of a sub word line driver of FIG. 1.

FIG. 2 is a circuit diagram of the sub word line driver 12 of FIG. 1.

The sub word line driver 12 comprises PMOS transistors PT1 and PT2, and NMOS transistors NT1, NT2 and NT3.

The PMOS transistor PT2 and the NMOS transistor NT1 pull up a sub word line SWL to a level of a predecoding signal FXi or pull down the sub word line SWL to a ground level in response to a main word line selecting signal MWL.

The PMOS transistor PT1 selectively applies the predecoding signal FXi to a source of the PMOS transistor PT2 in response to the block selecting activation signal /WSEN. The NMOS transistor NT2 pulls down the sub word line SWL to the ground level in response to the block selecting activation signal /WSEN.

The NMOS transistor NT3 pulls down the sub word line SWL to the ground level in response to a signal FXBi having an opposite phase to that of the predecoding signal FXi.

As a result, when the block selecting activation signal /WSEN is activated to a low level, the predecoding signal FXi is applied to the PMOS transistor PT2, and the main word line signal MWL is activated to a high level to drive the sub word line SWL as the predecoding signal FXi.

Figure 3:
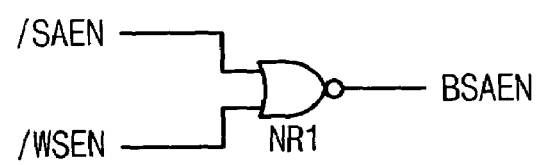
FIG. 3 is a circuit diagram of a sense amplifier control unit of FIG. 1.

FIG. 3 is a circuit diagram of the sense amplifier control unit 14 of FIG. 1.

The sense amplifier control unit 14 comprises a NOR gate NR1 for performing a NOR operation on a sense amplifier activating signal /SAEN and the block selecting activation signal /WSEN to output a block sense amplifier activating signal BSAEN. As a result, when the block selecting activation signal /WSEN is activated to a low level and the sense amplifier activating signal /SAEN is activated to a low level, the block sense amplifier activating signal BSAEN is activated to a high level.

Figure 4:
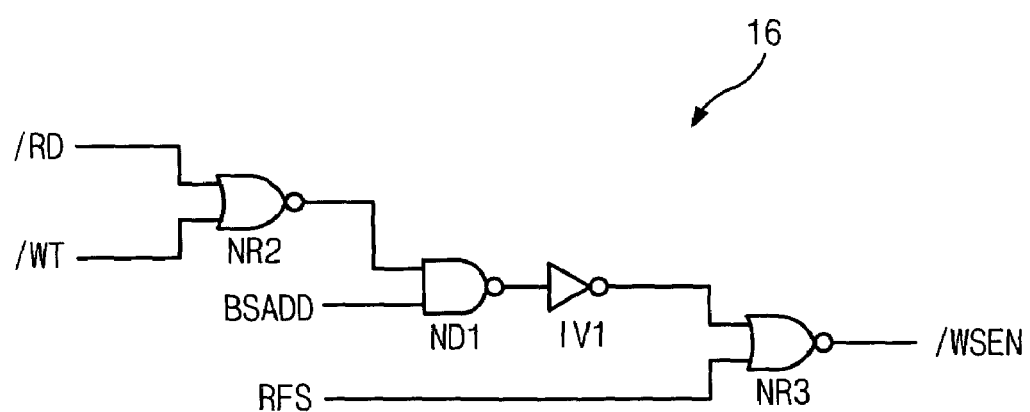
FIG. 4 is a circuit diagram of a block selecting activation control unit of FIG. 1.

FIG. 4 is a circuit diagram of the block selecting activation control unit 16 of FIG. 1.

The block selecting activation control unit 16 comprises NOR gates NR2 and NOR3, a NAND gate ND1, and an inverter IV1. The NOR gate NR2 performs a NOR operation on the read command /RD and the write command /WT. The NAND gate ND1 performs a NAND operation on an output signal from the NOR gate NR2 and a block selecting address BSADD. The inverter IV1 inverts an output signal from the NAND gate ND1. The NOR gate NR3 performs a NOR operation on an output signal from the inverter IV1 and the refresh signal RFS to output the block selecting activation signal /WSEN.

As a result, the block selecting activation signal /WSEN corresponding to a block selected at a read or write mode is activated. That is, if the block selecting address BSADD for selecting a specific block is activated, the corresponding block selecting activation signal /WSEN is activated, and the sense amplifier array 4 and the sub word line driver 12 included in the selected block are activated.

Meanwhile, all memory cell array blocks 2 are activated and refreshed regardless of the block selecting address BSADD at a refresh mode.

Accordingly, since the sub word line driver and the sense amplifier for driving a block selected at the read or write mode are activated in an embodiment of the present invention, the power consumption can be remarkably reduced than when the sub word line driver and the sense amplifier for driving all blocks are activated.

As described above, in a semiconductor memory device according to an embodiment of the present invention, the power consumption can be reduced by activating a sense amplifier and a sub word line driver for driving a memory cell array block selected at a read or write mode.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A low power semiconductor memory device comprising:
   a plurality of memory cell array blocks arranged in a matrix type and each comprising a plurality of memory cells;
   a block selecting activation control unit for outputting a block selecting activation signal in response to a read command, a write command, and block selecting address;
   a sense amplifier control unit for outputting a block sense amplifier activating signal in response to a sense amplifier activating signal and the block selecting activating signal;
   a plurality of sense amplifier arrays connected to the memory cell array blocks and each comprising a plurality of sense amplifiers, wherein the plurality of sense amplifiers sensing and amplifying data stored in the memory cells in response to the block sense amplifier activating signal; and
   a sub word line driver array connected to the memory cell array blocks, comprising a plurality of sub word line drivers, wherein the plurality of sub word line drivers are activated when the block selecting activation signal is activated, and wherein the plurality of sub word line drivers are driven by a main word line to select a sub word line.

2. The low power semiconductor memory device according to claim 1, wherein the sense amplifier control unit is positioned at a sub hole.

3. The low power semiconductor memory device according to claim 1, wherein the block sense amplifier activating signal is activated when a sense amplifier activating signal is activated and the block selecting activation signal is activated.

4. A low power semiconductor memory device comprising:
   a plurality of memory cell array blocks arranged in a matrix type and each comprising a plurality of memory cells;
   a plurality of sense amplifier arrays connected to the memory cell array blocks and each comprising a plurality of sense amplifiers for sensing and amplifing data stored in the memory cells;
   a sub word line driver array connected to the memory cell array block and comprising a plurality of sub word line drivers, the sub word line driving including:
      a driving unit for driving a sub word line as one of a predecoding signal and ground depending on a phase of a main word line; and
      an activation unit for activating the driving unit in response to a block selecting activation signal; and
   a block selecting activation control unit for outputting the block selecting activation signal which selectively activates the sub word line driver and the sense amplifier connected to the memory cell array block selected by a block selecting address.

5. The low power semiconductor memory device according to claim 4, wherein the driving unit comprises:
   a pull-up unit for driving the sub word line as the predecoding signal depending on a phase of the main word line; and
   a first pull-down unit for connecting the sub word line to ground depending on a phase of the main word line.

6. The low power semiconductor memory device according to claim 5, wherein the driving unit further comprises a second pull-down unit for connecting the sub word line to ground in response to a signal having an opposite phase to that of the predecoding signal.

7. The low power semiconductor memory device according to claim 4, wherein the sub word line driver further comprises a pull-down unit for connecting the sub word line to ground in response to the block selecting activation signal.

8. A low power semiconductor memory device comprising:
   a plurality of memory cell array blocks arranged in a matrix type and each comprising a plurality of memory cells;
   a plurality of sense amplifier arrays connected to the memory cell array blocks and each comprising a plurality of sense amplifiers for sensing and amplifying data stored in the memory cells;
   a sub word line driver array connected to the memory cell array block and comprising a plurality of sub word line drivers; and
   a block selecting activation control unit for outputting a block selecting activation signal which selectively activates the sub word line driver and the sense amplifier connected to the memory cell array block selected by a block selecting address, the block selecting activation control unit including:
- a first logic unit for outputting a signal which is activated when one of a read command and a write command is activated;
- a second logic unit for outputting a signal which is activated when the output signal from the first logic unit is activated and the block selecting address is activated; and
- a third logic unit for outputting a signal which is activated when a refresh signal is activated regardless of the output signal from the second logic unit.

9. The low power semiconductor memory device according to claim 8, wherein the first logic unit comprises a first NOR gate for performing a NOR operation on the read command and the write command.

10. The low power semiconductor memory device according to claim 8, wherein the second logic unit comprises a NAND gate for performing a NAND operation on an output signal from the first logic unit and the block selecting address.

11. The low power semiconductor memory device according to claim 8, wherein the third logic unit comprises a second NOR gate for performing a NOR operation on an output signal from the second logic unit and the refresh signal.

* * * * *